(12) United States Patent
Sung et al.

(10) Patent No.: US 11,926,898 B2
(45) Date of Patent: *Mar. 12, 2024

(54) PRESSURIZATION TYPE METHOD FOR MANUFACTURING METAL MONOATOMIC LAYER, METAL MONOATOMIC LAYER STRUCTURE, AND PRESSURIZATION TYPE APPARATUS FOR MANUFACTURING METAL MONOATOMIC LAYER

(71) Applicant: IUCF-HYU (INDUSTRY-UNIVERSITY COOPERATION FOUNDATION HANYANG UNIVERSITY), Seoul (KR)

(72) Inventors: Myung Mo Sung, Seoul (KR); Kyu-Seok Han, Seoul (KR); Hongbum Kim, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 339 days.

This patent is subject to a terminal disclaimer.

(21) Appl. No.: 17/154,093

(22) Filed: Jan. 21, 2021

(65) Prior Publication Data
US 2021/0164102 A1 Jun. 3, 2021

Related U.S. Application Data

(60) Division of application No. 16/172,179, filed on Oct. 26, 2018, now Pat. No. 10,941,488, which is a
(Continued)

(30) Foreign Application Priority Data
Apr. 29, 2016 (KR) .................. 10-2016-0052633

(51) Int. Cl.
*C23C 16/455* (2006.01)
*B01J 3/00* (2006.01)
(Continued)

(52) U.S. Cl.
CPC ......... *C23C 16/45557* (2013.01); *B01J 3/006* (2013.01); *B01J 3/02* (2013.01);
(Continued)

(58) Field of Classification Search
CPC ... C23C 16/14; C23C 16/52; C23C 16/45527; C23C 16/45557; B01J 3/02; B01J 3/03; B01J 3/006
See application file for complete search history.

(56) References Cited

U.S. PATENT DOCUMENTS 6,737,313 B1  5/2004 Marsh et al.
6,844,258 B1  1/2005 Fair et al.
(Continued)

FOREIGN PATENT DOCUMENTS

JP    2008-537979 A    10/2008
KR    10-2004-0038602 A    5/2004
(Continued)

OTHER PUBLICATIONS

Giyul Ham et al., "Tuning the Electronic Structure of Tin Sulfides Grown by Atomic Layer Deposition", ACS Appl. Mater. Interfaces, 2013, 8 pages, vol. 5.
(Continued)

*Primary Examiner* — Joseph A Miller, Jr.
(74) *Attorney, Agent, or Firm* — Sughrue Mion, PLLC

(57) ABSTRACT

A pressurization type method for manufacturing elementary metal may include a metal precursor gas pressurization dosing operation of, in a state where an outlet of a chamber having a substrate is closed, increasing a pressure in the chamber by providing a metal precursor gas consisting of
(Continued)

metal precursors, thereby adsorbing the metal precursors onto the substrate, a main purging operation of purging a gas after the metal precursor gas pressurization dosing operation, a reaction gas dosing operation of providing a reaction gas to reduce the metal precursors adsorbed on the substrate to elementary metal, after the main purging operation, and a main purging operation of purging a gas after the reaction gas dosing operation.

3 Claims, 19 Drawing Sheets

Related U.S. Application Data continuation of application No. PCT/KR2017/004579, filed on Apr. 28, 2017.

(51) Int. Cl.
    *B01J 3/02*     (2006.01)
    *B01J 3/03*     (2006.01)
    *C23C 16/14*    (2006.01)
    *C23C 16/52*    (2006.01)

(52) U.S. Cl.
    CPC ............ *B01J 3/03* (2013.01); *C23C 16/14* (2013.01); *C23C 16/45527* (2013.01); *C23C 16/52* (2013.01)

(56) References Cited

U.S. PATENT DOCUMENTS

| | | | |
|---|---|---|---|
| 7,135,418 B1 | 11/2006 | Papasouliotis | |
| 7,273,814 B2 | 9/2007 | Matsuda | |
| 2003/0013320 A1 | 1/2003 | Kim et al. | |
| 2003/0026989 A1* | 2/2003 | George | C23C 8/02 |
| | | | 257/E23.107 |
| 2008/0317972 A1 | 12/2008 | Hendriks et al. | |
| 2009/0130466 A1 | 5/2009 | Cheng et al. | |
| 2016/0365246 A1* | 12/2016 | Yamamoto | H01L 21/02488 |
| 2019/0055644 A1 | 2/2019 | Sung et al. | |
| 2019/0112704 A1 | 4/2019 | Sung et al. | |

FOREIGN PATENT DOCUMENTS

| | | |
|---|---|---|
| KR | 10-2007-0073464 A | 7/2007 |
| KR | 10-2009-0017073 A | 2/2009 |
| KR | 10-2015-0018218 A | 2/2015 |

OTHER PUBLICATIONS

Jay Yu Kim et al., "Tin Monosulfide Thin Films Grown by Atomic Layer Deposition Using Tin 2,4-Pentanedionate and Hydrogen Sulfide", J. Phys. Chem. C, 2010, 7 pages, vol. 114, No. 41.

International Search Report for PCT/KR2017/004579 dated Aug. 1, 2017.

R.K. Grubbs et al., "Gas phase reaction products during tungsten atomic layer deposition using WF6 and Si2H6", J. Vac. Sci. Technol. B, Jul./Aug. 2004, 11 pages, vol. 22, No. 4.

Mousa, Moataz Bellah M., et al., "Atmospheric Pressure Atomic Layer Deposition of Al2O3 Using Trimethyl Aluminum and Ozone" Langmuir, 2014, 30, 3741-3748. dx.doi.org/10.1021/la500796r.

Hoffmann, Lukas, et al., "Gas permeation barriers deposited by atmospheric pressure plasma enhanced atomic layer deposition". Journal of Vacuum Science & Technology A 34, 01A114 (2016), pp. 1-5. https://doi.org/10.1116/1.4935337.

Oviroh, Peter Ozaveshe, et al., "New development of atomic layer deposition: processes, methods and applications". Science and Technology of Advanced Materials 2019, vol. 20, No. 1, 465-496. https://doi.org/10.1080/ 14686996.2019.1599694.

Oladipo, Olufunsho, et al., "Operating pressure influences over micro trenches in exposure time introduced atomic layer deposition". International Journal of Heat and Mass Transfer, 153 (2020) 119602, pp. 1-17. https://doi.org/10.1016/j.ijheatmasstransfer.2020. 119602.

* cited by examiner

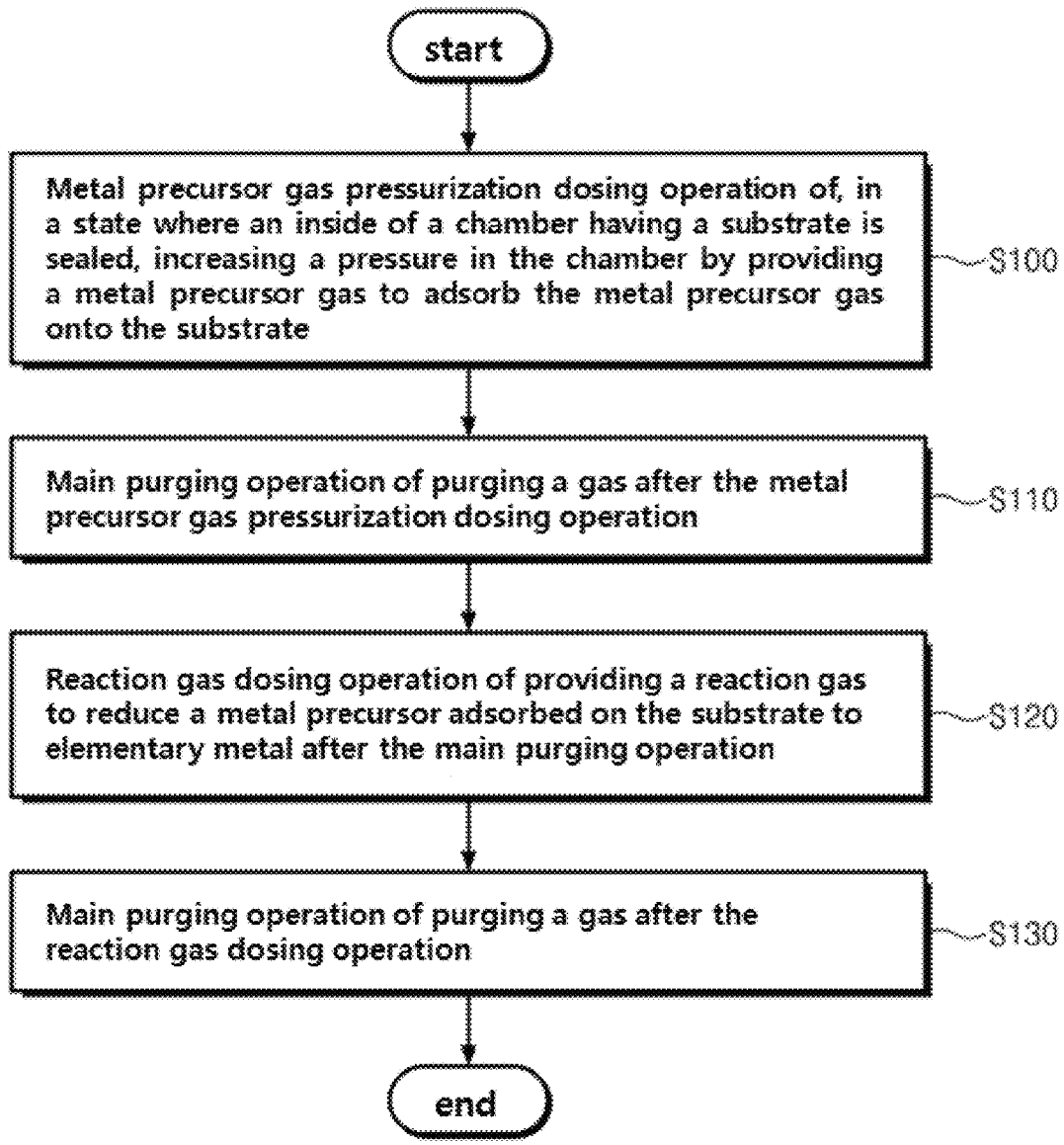
[Fig. 1]

[Fig. 2]
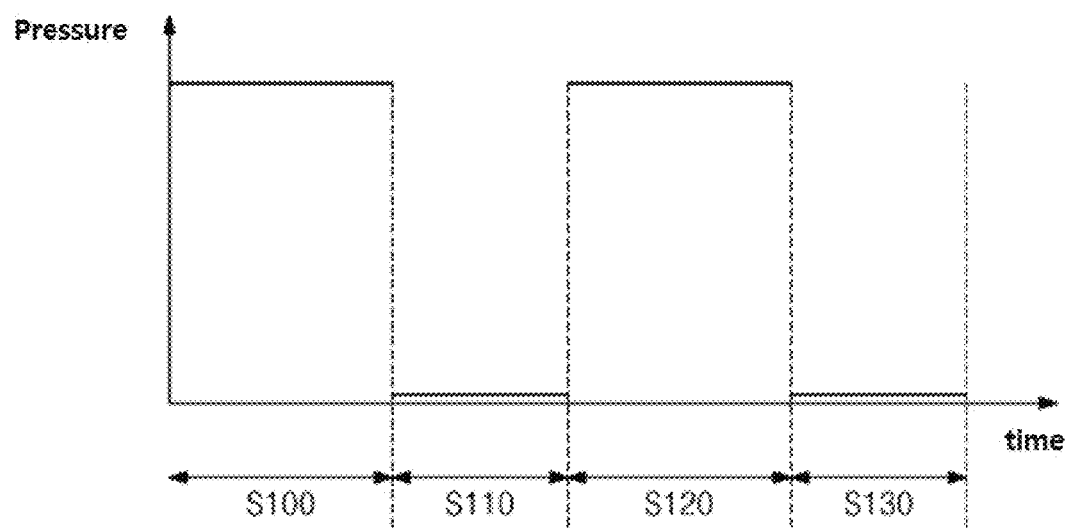

[Fig. 3]
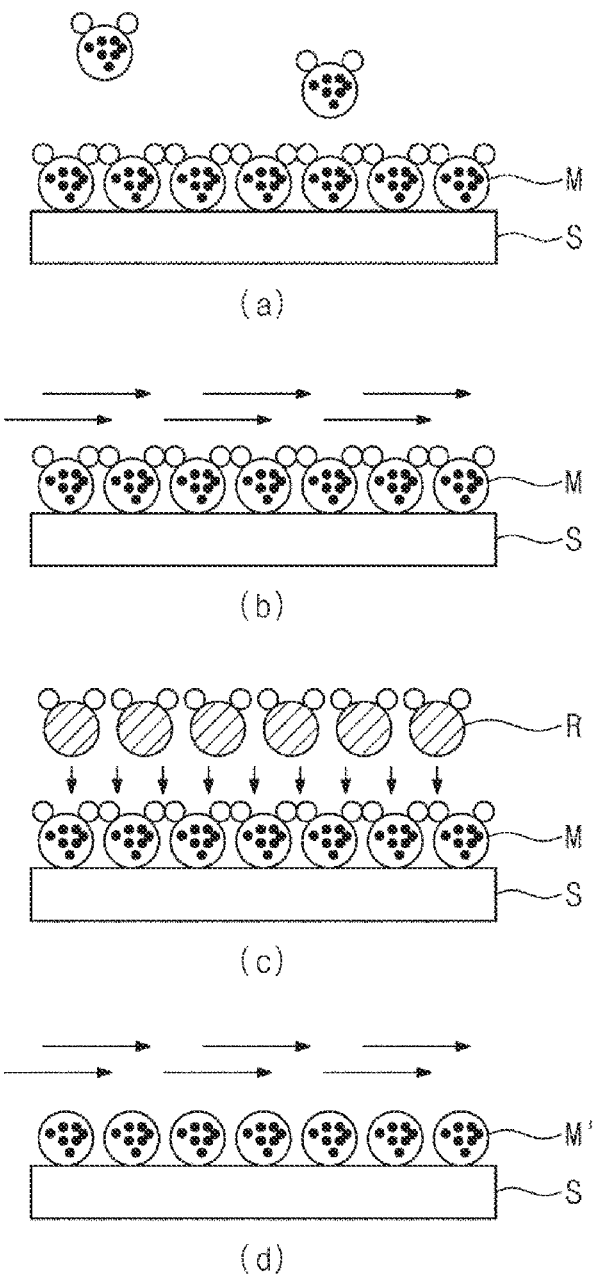

[Fig. 4]
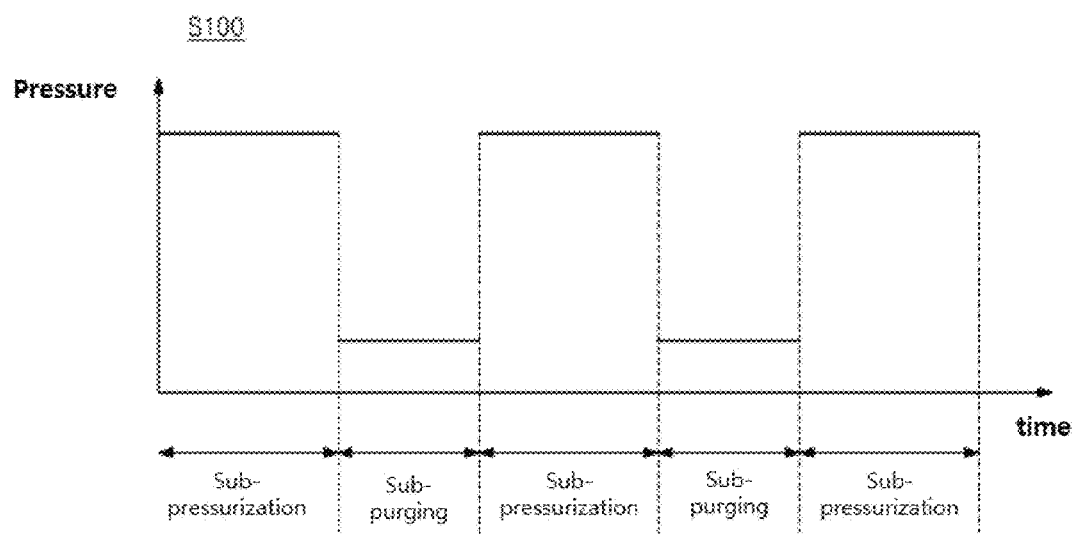

[Fig. 5]
S100
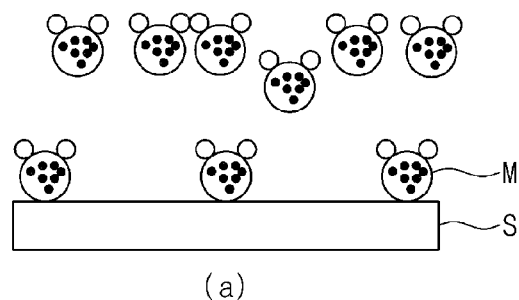
(a)
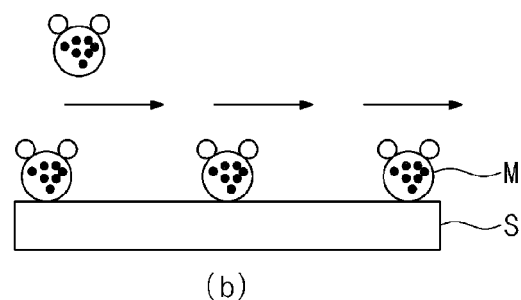
(b)
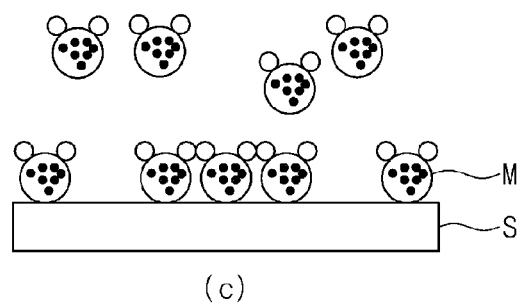
(c)
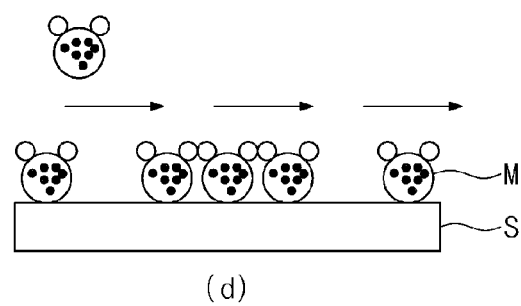
(d)
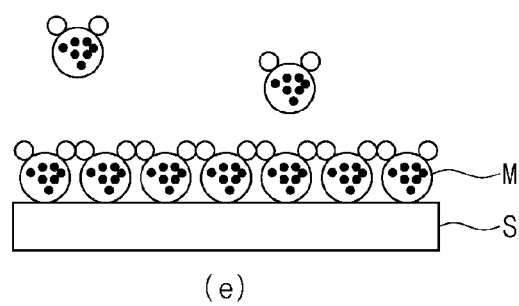
(e)

[Fig. 6]
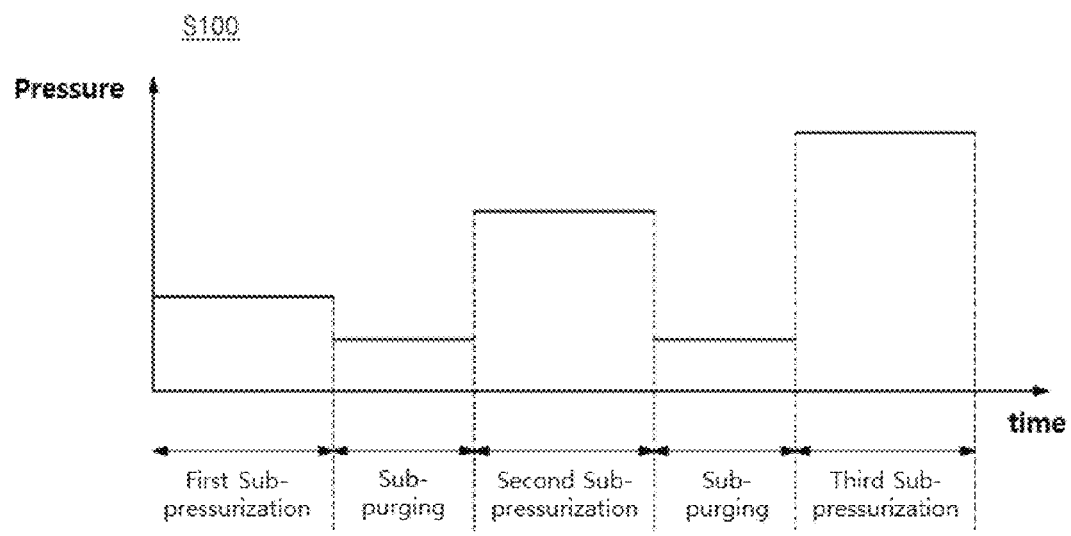

[Fig. 7]
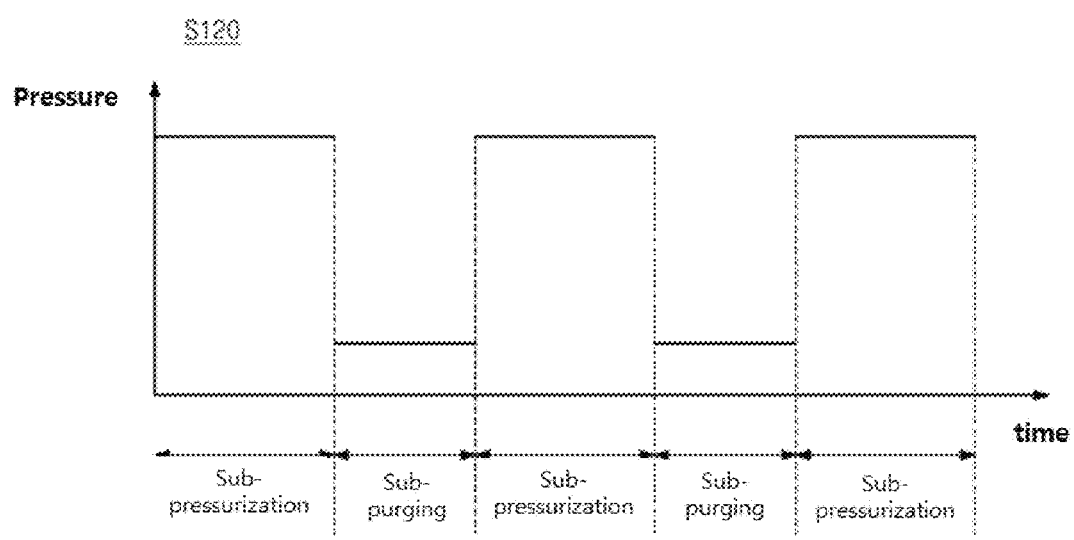

[Fig. 8]
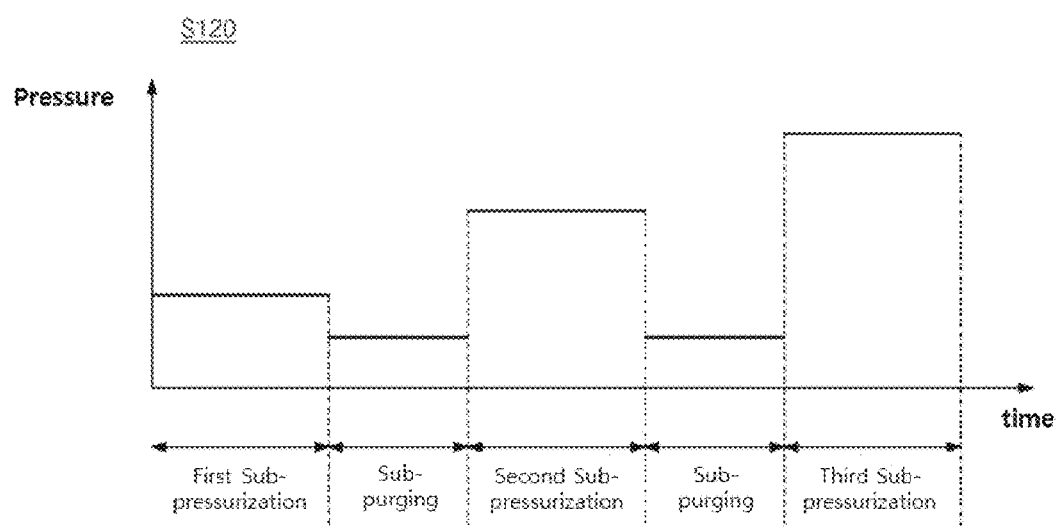

[Fig. 9]
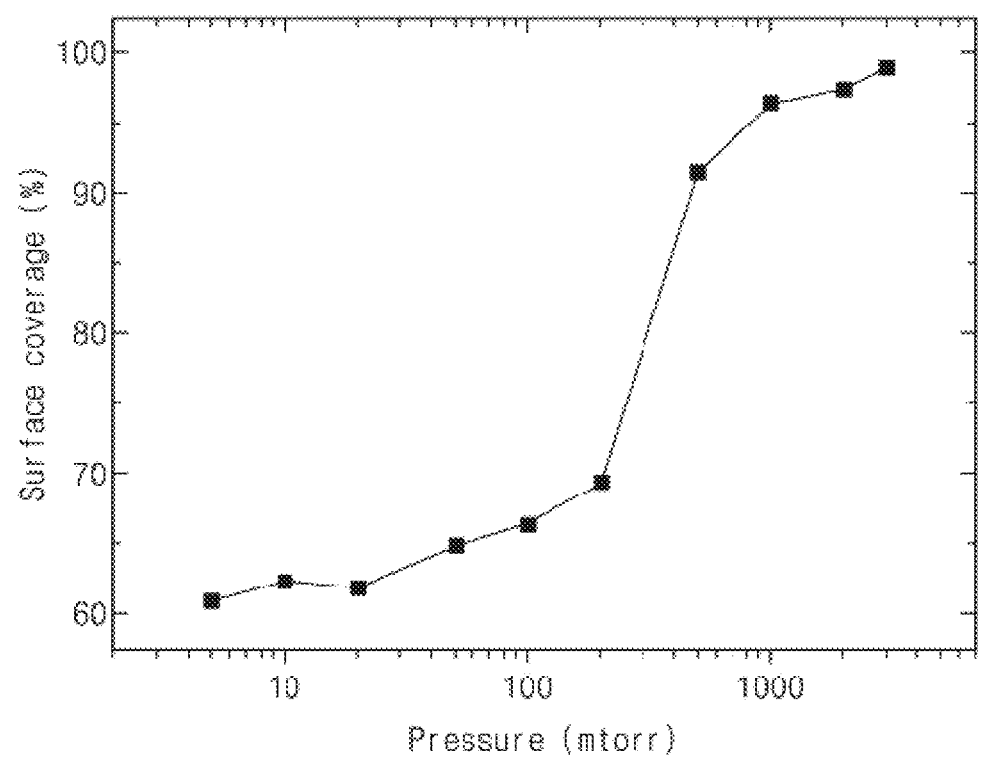

[Fig. 10]
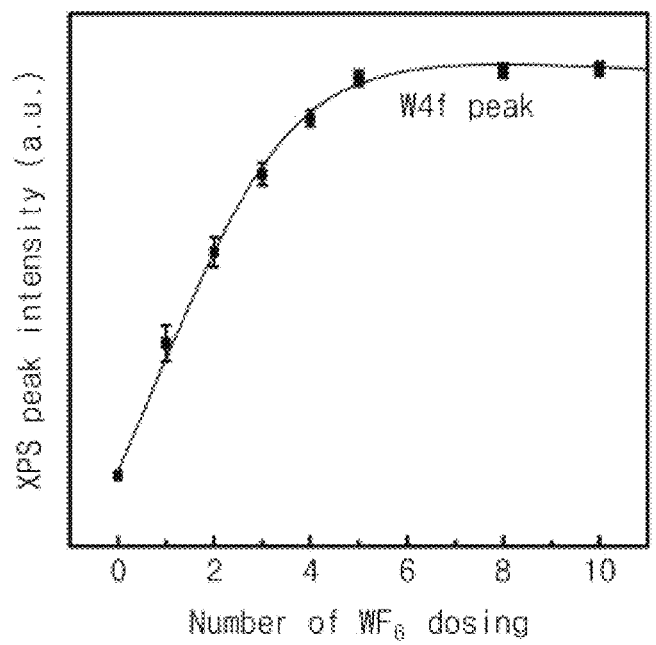
(a)
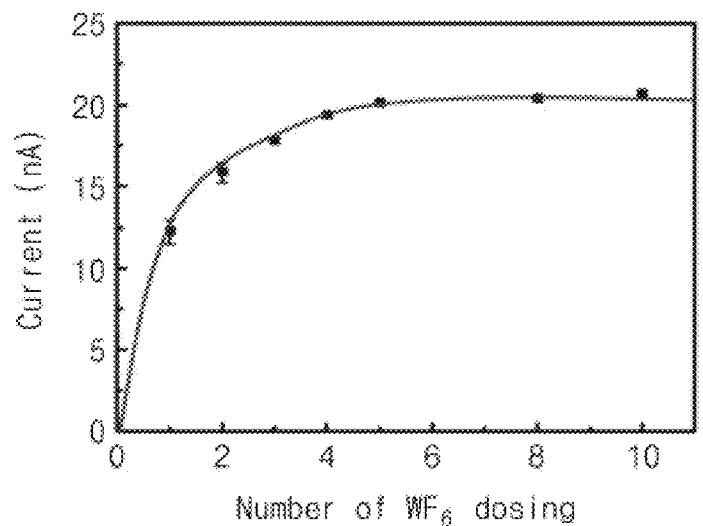
(b)

[Fig. 11]
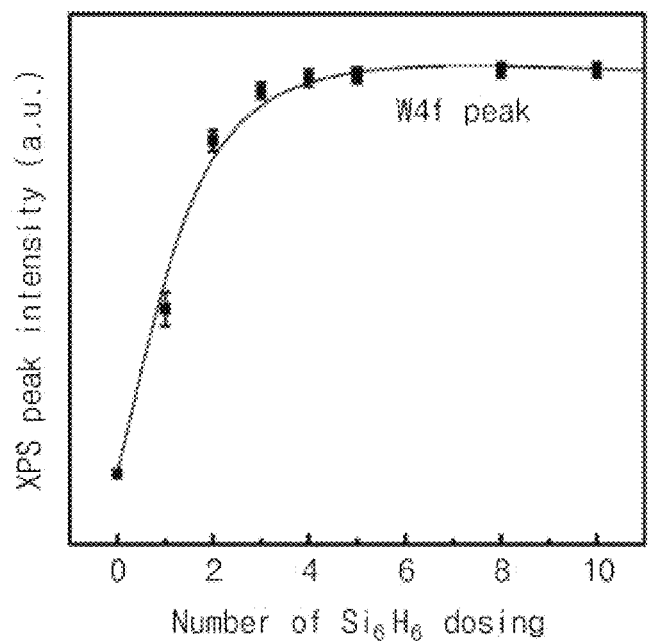
(a)
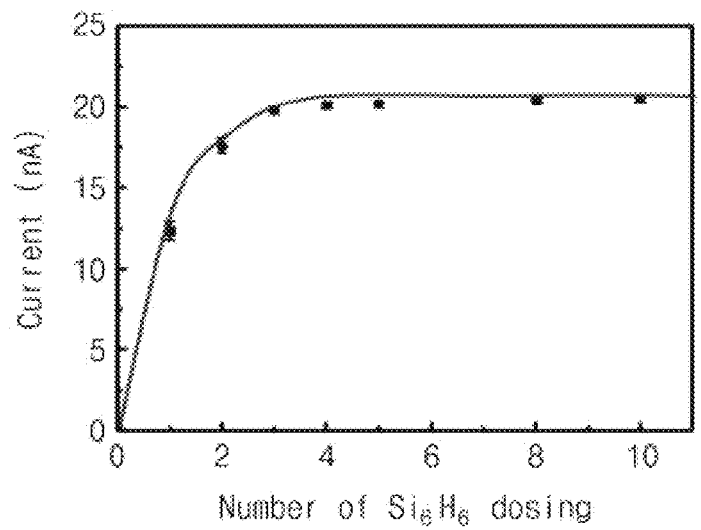
(b)

[Fig. 12]
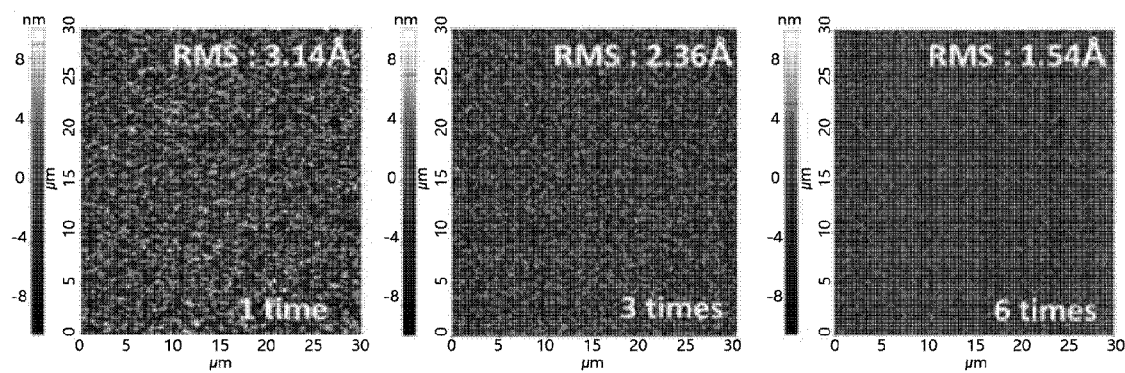

[Fig. 13]
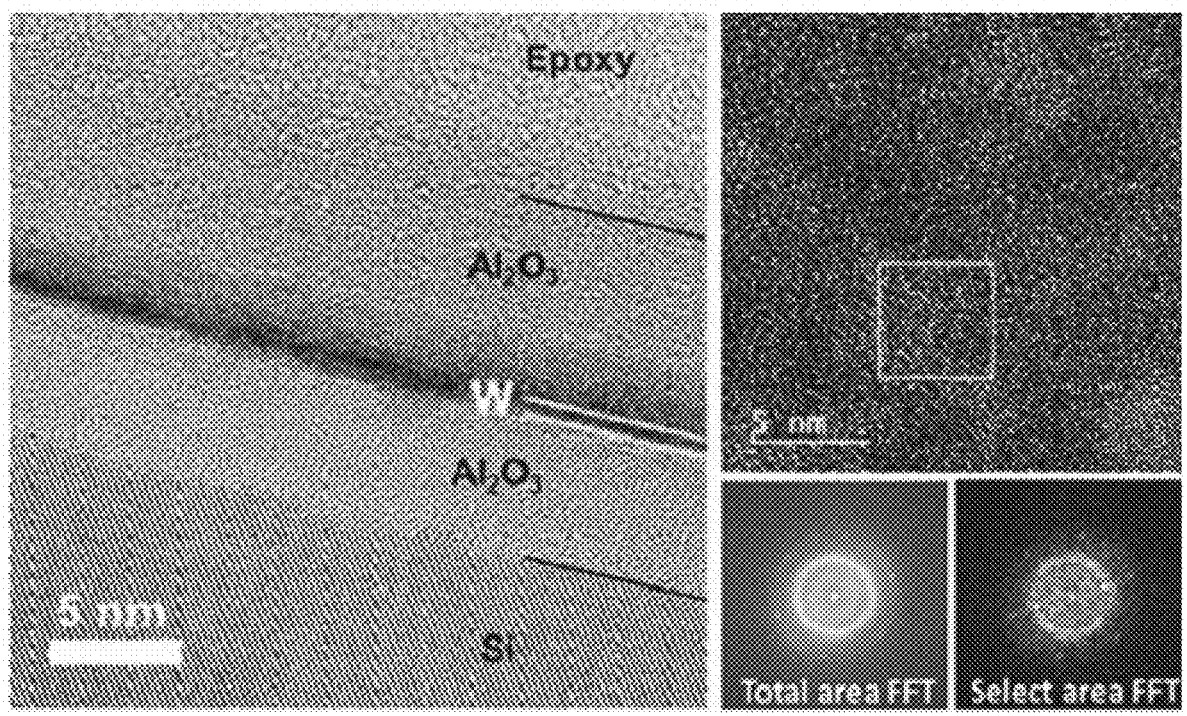

【Fig. 14】
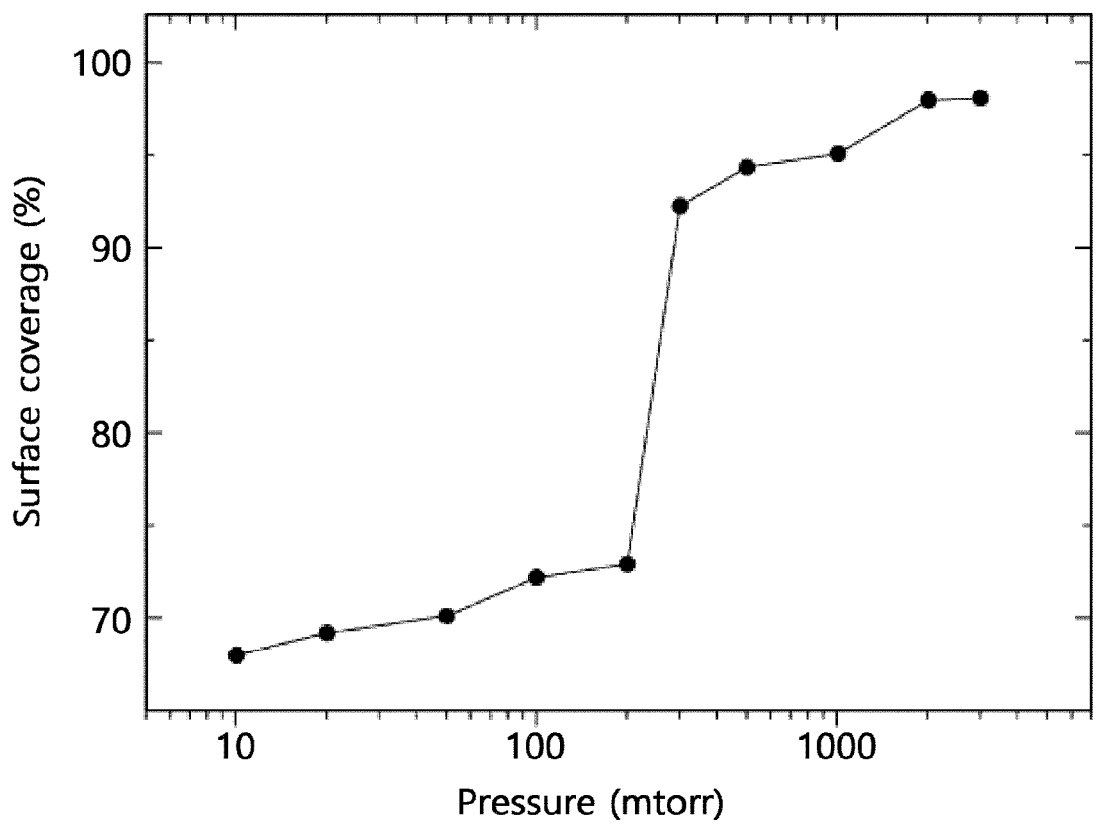

[Fig. 15]
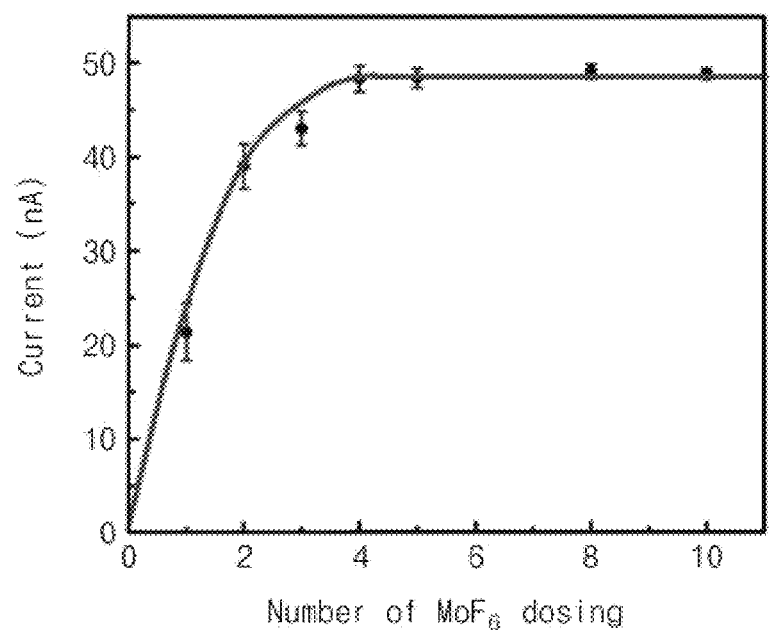
(a)
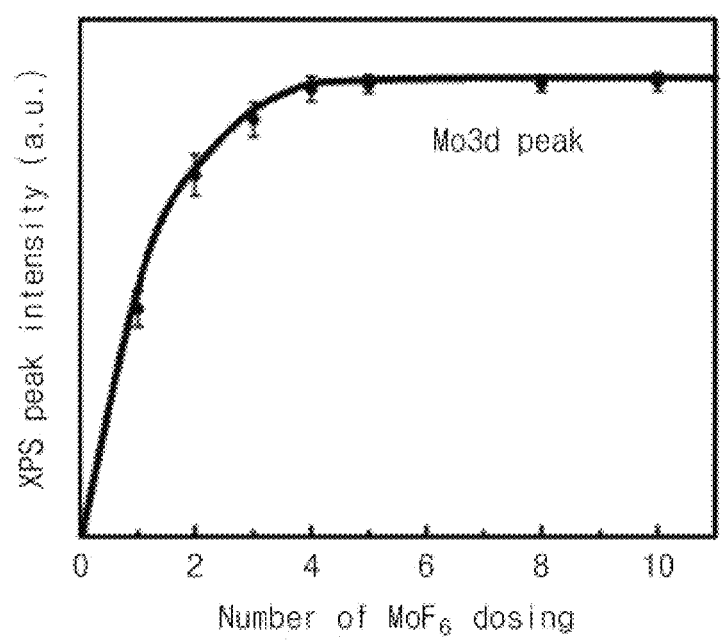
(b)

[Fig. 16]
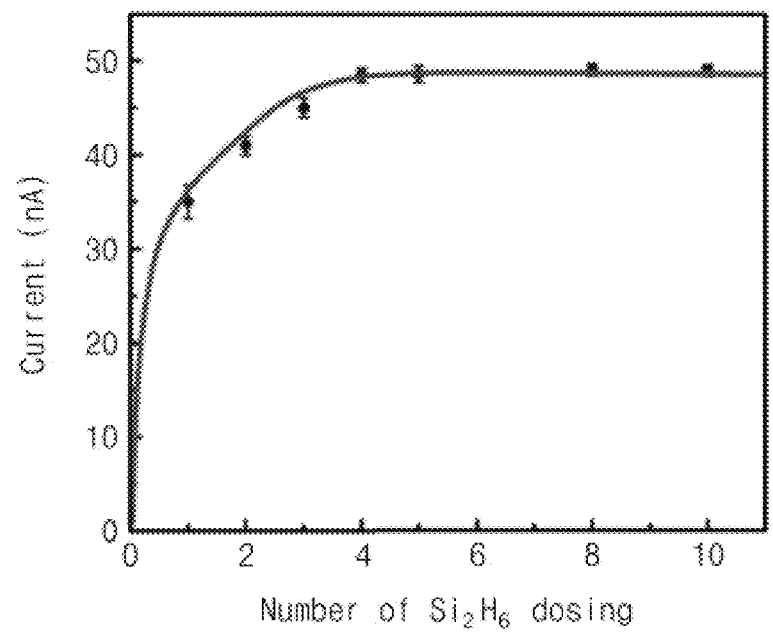
(a)
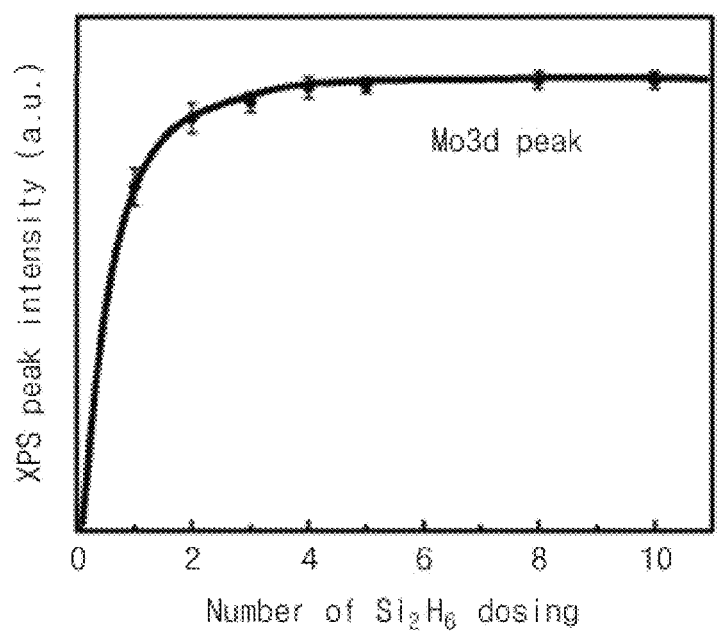
(b)

[Fig. 17]
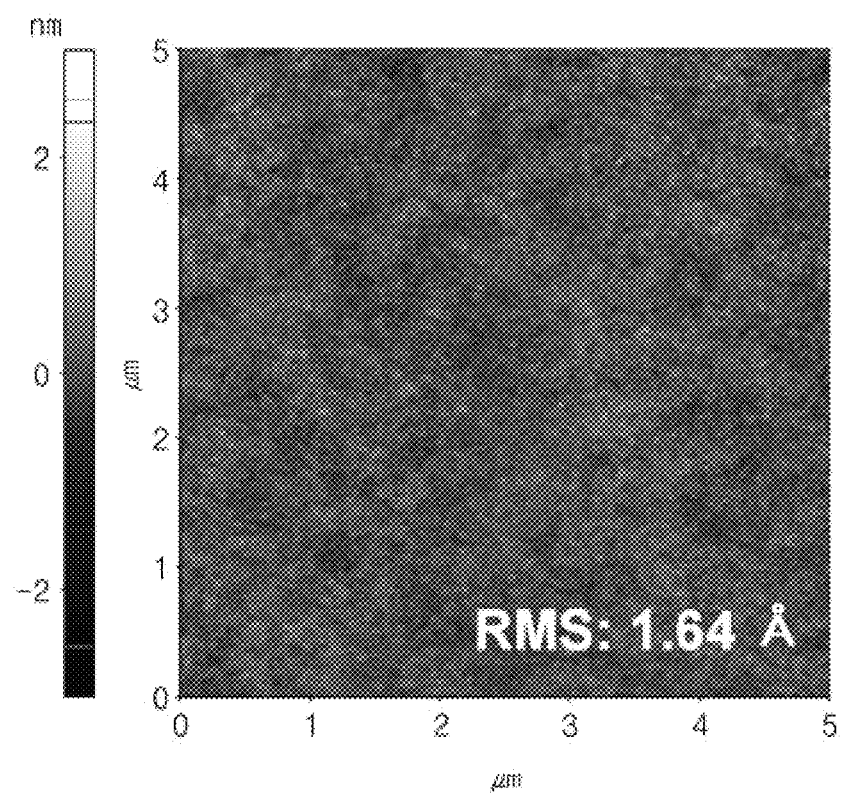

[Fig. 18]
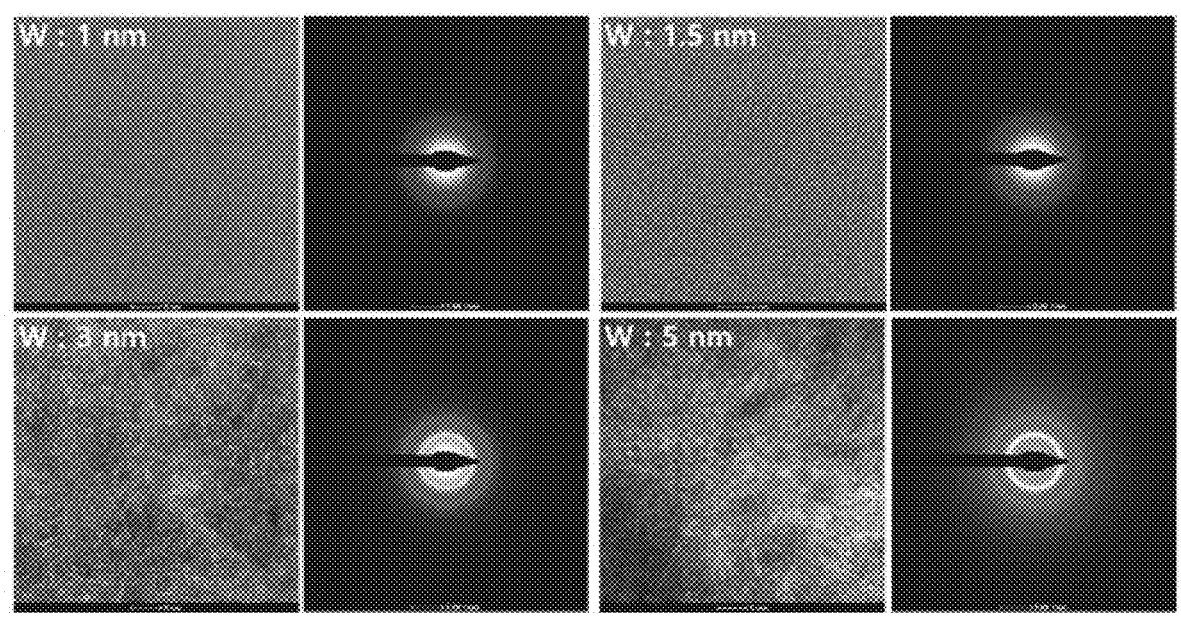

[Fig. 19]
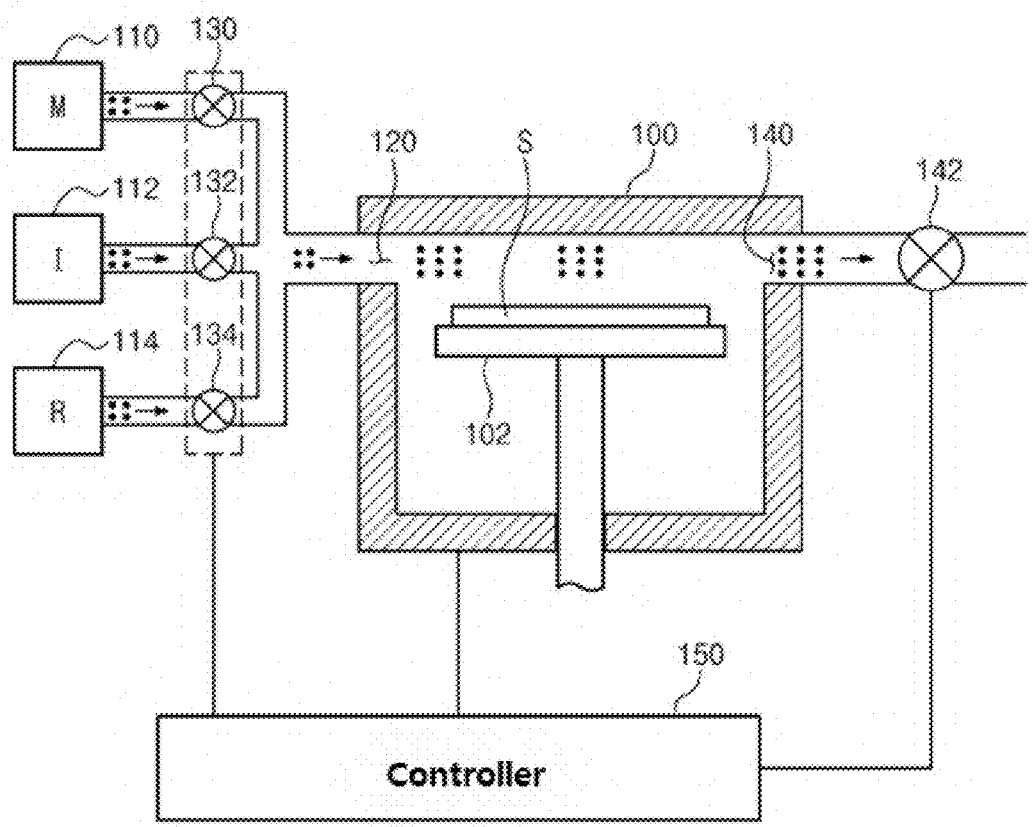

PRESSURIZATION TYPE METHOD FOR MANUFACTURING METAL MONOATOMIC LAYER, METAL MONOATOMIC LAYER STRUCTURE, AND PRESSURIZATION TYPE APPARATUS FOR MANUFACTURING METAL MONOATOMIC LAYER

CROSS-REFERENCE TO RELATED APPLICATION

This application is a Divisional of U.S. application Ser. No. 16/172,179 filed Oct. 26, 2018, which is a continuation of International Application No. PCT/KR2017/004579, which was filed on Apr. 28, 2017 and claims priority to Korean Patent Application No. 10-2016-0052633 filed on Apr. 29, 2016, in the Korean Intellectual Property Office, the disclosures of all of which are hereby incorporated by reference in their entireties.

BACKGROUND

1. Field

The present disclosure herein relates to a pressurization type method for manufacturing elementary metal, elementary metal, and a pressurization type apparatus for manufacturing elementary metal. More particularly, the present disclosure relates to pressurization type method and apparatus for manufacturing a conformal elementary metal by dosing a metal precursor at high pressure, and elementary metal manufactured thereby.

2. Description of the Related Art

Typically, a physical vapor deposition (PVD) technique or a chemical vapor deposition (CVD) technique may be used to manufacture a semiconductor device. However, there are limitations in applying these techniques to a process for manufacturing a nano-scale ultra-highly integrated device.

However, an atomic layer deposition (ALD) technique may deposit a nano-scale thin layer with excellent uniformity on a three-dimensional structure having a complex shape and thus may be spotlighted as an essential deposition technique for manufacturing a nano-scale semiconductor device.

Meanwhile, high-performance and multi-functional devices have been increasingly demanded with the development of smart devices and/or artificial intelligence computer techniques.

However, a typical method of developing devices by reducing sizes of MOSFETs may deteriorate the devices by occurrence of high-temperature heat. Accordingly, a typical method through scaling down may have fundamental limitations.

Thus, it may be required to secure future-oriented device techniques.

SUMMARY

The present disclosure may provide elementary metal consisting of a monolayer, and pressurization type method and apparatus for manufacturing elementary metal to provide the same.

The present disclosure may also provide elementary metal having high surface coverage, and pressurization type method and apparatus for manufacturing elementary metal to provide the same.

The present disclosure may further provide elementary metal having low surface roughness, and pressurization type method and apparatus for manufacturing elementary metal to provide the same.

In an aspect, a pressurization type method for manufacturing elementary metal may include a metal precursor gas pressurization dosing operation of, in a state where an outlet of a chamber having a substrate is closed, increasing a pressure in the chamber by providing a metal precursor gas consisting of metal precursors, thereby adsorbing the metal precursors onto the substrate; a main purging operation of purging a gas after the metal precursor gas pressurization dosing operation; a reaction gas dosing operation of providing a reaction gas to reduce the metal precursors adsorbed on the substrate to elementary metal, after the main purging operation; and a main purging operation of purging a gas after the reaction gas dosing operation.

In an embodiment, the pressure in the chamber may range from 0.3 Torr to 100 Torr in the metal precursor gas pressurization dosing operation.

In an embodiment, a surface coverage of the metal precursors adsorbed on the substrate may be 90% or more in the metal precursor gas pressurization dosing operation.

In an embodiment, the metal precursor gas pressurization dosing operation may include at least two sub-pressurization dosing operations and a sub-purging operation between the at least two sub-pressurization dosing operations.

In an embodiment, a magnitude of a pressure of each of the at least two sub-pressurization dosing operations may increase depending on the number of the sub-pressurization dosing operation.

In an embodiment, pressures of the at least two sub-pressurization dosing operations may be equal to each other.

In an embodiment, a pressure in the chamber in the sub-purging operation may be higher than a pressure in the chamber in the main purging operation.

In an embodiment, a pressure in the chamber in the sub-purging operation may be equal to a pressure in the chamber in the main purging operation.

In an embodiment, the at least two sub-pressurization dosing operations may include four or more sub-pressurization dosing operations.

In an embodiment, process temperatures of the metal precursor gas pressurization dosing operation, the main purging operations and the reaction gas dosing operation may be equal to each other.

In an embodiment, the process temperature may range from 100 degrees Celsius to 200 degrees Celsius.

In an embodiment, the reaction gas dosing operation may include at least two sub-pressurization dosing operations and a sub-purging operation between the at least two sub-pressurization dosing operations.

In an embodiment, the metal precursor gas may include tungsten hexafluoride ($WF_6$), the reaction gas may include disilane ($Si_2H_6$), and the elementary metal may be formed of tungsten (W).

In an embodiment, the metal precursor gas may include molybdenum hexafluoride ($MoF_6$), the reaction gas may include disilane ($Si_2H_6$), and the elementary metal may be formed of molybdenum (Mo).

In an aspect, elementary metal may be manufactured by the pressurization type method for manufacturing elementary metal.

In an aspect, a pressurization type apparatus for manufacturing elementary metal may include an inlet into which a metal precursor gas consisting of metal precursors, an inert gas, a reaction gas, and an inert gas are sequentially provided; a chamber connected to the inlet and configured to receive a substrate; an outlet through which a gas injected in the chamber is exhausted; and a controller increasing a pressure in the chamber to adsorb the metal precursor gas onto the substrate in a state where an inside of the chamber having the substrate is sealed by closing the outlet, when the metal precursor gas is provided into the chamber.

In an embodiment, the controller may control the pressure in the chamber in a range of 0.3 Torr to 100 Torr when the metal precursor gas is provided into the chamber.

In an embodiment, a surface coverage of the metal precursor gas adsorbed on the substrate may be 90% or more by the pressure in the chamber.

In an embodiment, the controller may provide at least two sub-pressurization dosing pressures and a sub-purging pressure between the at least two sub-pressurization dosing pressures, when the metal precursor gas is provided into the chamber.

In an embodiment, a magnitude of each of the at least two sub-pressurization dosing pressures may increase depending on the number of sub-pressurization dosing.

In an embodiment, pressures of the at least two sub-pressurization dosing pressures may be equal to each other.

In an embodiment, the controller may control the sub-purging pressure in such a way that the sub-purging pressure is higher than a main purging pressure at which the inert gas is supplied into the chamber.

In an embodiment, the controller may control the sub-purging pressure in such a way that the sub-purging pressure is equal to a main purging pressure at which the inert gas is supplied into the chamber.

In an embodiment, the metal precursor gas may include tungsten hexafluoride ($WF_6$), the reaction gas may include disilane ($Si_2H_6$), and the elementary metal may be formed of tungsten (W).

In an embodiment, the metal precursor gas may include molybdenum hexafluoride ($MoF_6$), the reaction gas may include disilane ($Si_2H_6$), and the elementary metal may be formed of molybdenum (Mo).

In an aspect, elementary metal may have a predetermined thickness, may be formed of a single metal, and may have an amorphous phase.

In an embodiment, the predetermined thickness may be 5.0 nm or less.

BRIEF DESCRIPTION OF THE DRAWINGS

FIG. 1 is a flowchart illustrating a pressurization type method for manufacturing elementary metal, according to an embodiment of the inventive concepts.

FIG. 2 is a diagram illustrating a pressure profile according to an embodiment of the inventive concepts.

FIG. 3 is a conceptual view illustrating a pressurization type method for manufacturing elementary metal, according to an embodiment of the inventive concepts.

FIG. 4 is a diagram illustrating a first modified pressure profile in an operation S100 according to an embodiment of the inventive concepts.

FIG. 5 is a conceptual view illustrating a pressurization type method for manufacturing elementary metal according to the first modified pressure profile of the inventive concepts.

FIG. 6 is a diagram illustrating a second modified pressure profile in the operation S100 according to an embodiment of the inventive concepts.

FIG. 7 is a diagram illustrating a first modified pressure profile in an operation S120 according to an embodiment of the inventive concepts.

FIG. 8 is a diagram illustrating a second modified pressure profile in the operation S120 according to an embodiment of the inventive concepts.

FIG. 9 is a graph showing experimental results of a surface coverage according to a dosing pressure of a tungsten metal precursor gas according to an embodiment of the inventive concepts.

FIG. 10 is a graph showing experimental results of XPS and current according to the number of sub-dosing of a tungsten metal precursor gas according to an embodiment of the inventive concepts.

FIG. 11 is a graph showing experimental results of XPS and current according to the number of sub-pressurization dosing of a reaction gas according to an embodiment of the inventive concepts.

FIG. 12 shows images showing a surface roughness change according to the number of sub-pressurization dosing of a tungsten metal precursor gas according to an embodiment of the inventive concepts.

FIG. 13 shows TEM images of a tungsten monolayer according to an embodiment of the inventive concepts.

FIG. 14 is a graph showing experimental results of a surface coverage according to a dosing pressure of a molybdenum metal precursor gas according to an embodiment of the inventive concepts.

FIG. 15 is a graph showing experimental results of XPS and current according to the number of sub-dosing of a molybdenum metal precursor gas according to an embodiment of the inventive concepts.

FIG. 16 is a graph showing experimental results of XPS and current according to the number of sub-pressurization dosing of a reaction gas according to an embodiment of the inventive concepts.

FIG. 17 is an image showing a surface roughness of a molybdenum monolayer according to an embodiment of the inventive concepts.

FIG. 18 is a crystal image of elementary metal manufactured according to an embodiment of the inventive concepts.

FIG. 19 is a schematic view illustrating an apparatus for manufacturing elementary metal, according to an embodiment of the inventive concepts.

DETAILED DESCRIPTION OF THE EMBODIMENTS

The inventive concepts will now be described more fully hereinafter with reference to the accompanying drawings, in which exemplary embodiments of the inventive concepts are shown. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts.

It will be understood that when an element such as a layer, region or substrate is referred to as being "on" another element, it can be directly on the other element or intervening elements may be present. In addition, in the drawings, the thicknesses of layers and regions are exaggerated for clarity.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. As used herein, the term "and/or" includes any and all combinations of one or more of the associated listed items.

The terminology used herein is for the purpose of describing particular embodiments only and is not intended to limit the invention. As used herein, the singular terms "a", "an" and "the" are intended to include the plural forms as well, unless the context clearly indicates otherwise. It will be further understood that the terms "comprises", "comprising", "includes", "including", "have", "has" and/or "having" when used herein, specify the presence of stated features, integers, steps, operations, elements, and/or components, but do not preclude the presence or addition of one or more other features, integers, steps, operations, elements, components, and/or groups thereof. Furthermore, it will be understood that when an element is referred to as being "connected" or "coupled" to another element, it may be directly connected or coupled to the other element or intervening elements may be present.

In the present specification, a value in a range of 'A' to 'B' may mean that the value is equal to or greater than 'A' and equal to or less than 'B'.

In addition, in explanation of the present invention, the descriptions to the elements and functions of related arts may be omitted if they obscure the subjects of the inventive concepts.

FIG. 1 is a flowchart illustrating a pressurization type method for manufacturing elementary metal, according to an embodiment of the inventive concepts, FIG. 2 is a diagram illustrating a pressure profile according to an embodiment of the inventive concepts, and FIG. 3 is a conceptual view illustrating a pressurization type method for manufacturing elementary metal, according to an embodiment of the inventive concepts.

Referring to FIG. 1, a pressurization type method for manufacturing elementary metal, according to an embodiment of the inventive concepts, may include at least one operation of a metal precursor gas pressurization dosing operation of, in a state where an inside of a chamber having a substrate is sealed, increasing a pressure in the chamber by providing a metal precursor gas to adsorb the metal precursor gas onto the substrate, a main purging operation of purging a gas after the metal precursor gas pressurization dosing operation, a reaction gas dosing operation of providing a reaction gas to reduce a metal precursor adsorbed on the substrate to elementary metal after the main purging operation, and a main purging operation of purging a gas after the reaction gas dosing operation. Hereinafter, each of the operations will be described in detail.

Operation S100

The operation S100 may be an operation of pressurizing and dosing the metal precursor gas to adsorb the metal precursor gas onto the substrate.

Here, the metal precursor gas is not limited to a specific material and may be selected depending on a kind of elementary metal to be deposited. For example, when a tungsten elementary metal is deposited, a metal precursor gas may include tungsten hexafluoride ($WF_6$). For another example, when a molybdenum elementary metal is deposited, the metal precursor gas may include molybdenum hexafluoride ($MoF_6$). In addition, the substrate is not limited to a specific substrate. For example, the substrate may be a silicon substrate. Hereinafter, unless otherwise specified, the metal precursor gas may mean tungsten hexafluoride, and the substrate may mean the silicon substrate.

In detail, the metal precursor gas pressurization dosing operation may include an operation of evacuating a carrier gas, an operation of supplying the metal precursor gas into the chamber to increase and maintain the pressure, and an operation of reducing the pressure in the chamber.

The operation of evacuating the carrier gas may be an operation of evacuating impurities (e.g., an inert gas) which may exist in the chamber. The operation of evacuating the carrier gas may not be an essential operation but may be an optional operation. Hereinafter, the operation of evacuating the carrier gas may be omitted.

The operation of supplying the metal precursor gas into the chamber to increase and maintain the pressure may be performed in the state where the inside of the chamber having the substrate is sealed. For example, the metal precursor gas may be supplied into the chamber in a state where an outlet valve of the chamber is closed, and thus the inside of the chamber may be induced to high pressure and the induced high pressure may be maintained. The high pressure may be maintained for a certain time, and thus the metal precursor gas may be adsorbed onto a surface of the substrate in the high pressure atmosphere.

According to an embodiment, the pressure in the chamber in the operation S100 may be maintained in a range of 0.3 Torr to 100 Torr. If the pressure in the chamber is lower than 0.3 Torr, an adsorption rate of the metal precursor gas may be remarkably reduced. In more detail, if the pressure in the chamber is lower than 0.3 Torr, spaces between adsorbed metal precursors may become narrow by a spatial volume occupied by metal precursors previously adsorbed on the surface of the substrate. Metal precursors to be subsequently adsorbed may not permeate into the narrow spaces between the previously adsorbed metal precursors. In other words, the spatial volume occupied by the previously adsorbed metal precursors may hinder adsorption of the metal precursors to be subsequently adsorbed. Thus, if the pressure in the chamber is lower than 0.3 Torr, a surface coverage may be remarkably reduced.

On the contrary, when the pressure in the chamber is equal to or higher than 0.3 Torr, the metal precursors may be adsorbed onto the surface of the substrate by high-pressure driving force even though previously adsorbed metal precursors exist.

However, if the pressure in the chamber is higher than 100 Torr, the surface of the substrate may be damaged by the metal precursor gas.

Thus, in the operation S100, the pressure in the chamber may be the high pressure and may range from 0.3 Torr to 100 Torr.

As a result, in the operation S100, the metal precursor M may be adsorbed on the surface of the substrate S, as illustrated in FIG. 3.

Operation S110

The main purging operation may be performed after the metal precursor gas pressurization dosing operation (S110). An inert gas may be used in the main purging operation. For example, the inert gas may include argon (Ar) or nitrogen ($N_2$).

A pressure in the chamber by the main purging operation may be lower than that in the operation S100, as illustrated in FIG. 2.

Thus, an excess metal precursor gas which is not adsorbed on the surface of the substrate may be removed or evacuated in the operation S110, as illustrated in FIG. 3.

Operation S120

The reaction gas dosing operation of providing the reaction gas may be performed to reduce the metal precursor adsorbed on the substrate to the elementary metal (S120).

The reaction gas may be formed of a material for reducing the metal precursor gas to a metal. For example, when the metal precursor is tungsten hexafluoride ($WF_6$) or molybdenum hexafluoride ($MoF_6$), the reactant (or a reaction gas) may include disilane ($Si_2H_6$). Hereinafter, the reaction gas may mean a disilane ($Si_2H_6$) gas unless otherwise specified.

The reaction gas dosing operation may include an operation of evacuating a carrier gas, an operation of supplying the reaction gas into the chamber to increase and maintain a pressure, and an operation of reducing the pressure in the chamber. Hereinafter, descriptions to the operation of evacuating the carrier gas may be omitted.

The operation of supplying the reaction gas may be performed in a state where the chamber is closed or sealed, or may be performed in a state where the chamber is opened.

For example, when the reaction gas is supplied in the state where the chamber is closed or sealed, the reaction gas may be supplied into the chamber in a state where the outlet valve of the chamber is closed, and thus the reaction gas may induce the metal precursor adsorbed on the substrate to be reduced in a high pressure atmosphere, as described above in the operation S100. According to an embodiment, the pressure in the chamber in the operation S120 may be maintained in a range of 0.3 Torr to 100 Torr. For example, the pressure at which the operation S120 is performed may be equal to the pressure at which the operation S100 is performed, as illustrated in FIG. 2.

Alternatively, when the reaction gas is supplied in the state where the chamber is opened, the reaction gas may be supplied into the chamber in a state where the outlet valve of the chamber is opened, thereby forming a laminar flow. Thus, the reaction gas may induce the metal precursor adsorbed on the substrate to be reduced.

The reaction gas R may react with the metal precursor M adsorbed on the surface of the substrate S by the operation S120, as illustrated in FIG. 3.

Operation S130

The main purging operation may be performed after the reaction gas dosing operation (S130). An inert gas may be used in the main purging operation. For example, the inert gas may include argon (Ar) or nitrogen ($N_2$).

According to an embodiment, a pressure in the chamber by the main purging operation may be low like the operation S110, as illustrated in FIG. 2.

Thus, in the operation S130, an excess reaction gas which is not adsorbed on the surface of the substrate may be removed or evacuated but metal mono-atoms M' may remain, as illustrated in FIG. 3.

The method for manufacturing the elementary metal according to the embodiment of the inventive concepts was described above with reference to FIGS. 1 to 3. The elementary metal having high uniformity and low surface roughness may be provided by the method for manufacturing the elementary metal according to the embodiment of the inventive concepts.

In particular, the method for manufacturing the elementary metal according to the embodiment of the inventive concepts may provide the metal precursor gas in the state where the chamber is sealed or closed, and thus the pressure in the chamber may be maintained at the high pressure. As a result, the metal precursor may be induced to be easily adsorbed onto the surface of the substrate.

Meanwhile, according to a typical atomic layer deposition method, a precursor gas may be provided in a state where a chamber is not sealed but is opened, and thus a precursor may be adsorbed onto a surface of a substrate in a state where a pressure in the chamber is a low pressure. In other words, according to the typical atomic layer deposition method, the precursor gas may be adsorbed onto the surface of the substrate by forming a laminar flow with the precursor gas on the surface of the substrate. According to this typical atomic layer deposition method, since the pressure in the chamber is low, a metal layer formed on the substrate by a metal precursor gas may not have high uniformity and low surface roughness.

In addition, when the pressure in the chamber is increased by a typical technique, the increased pressure may hinder formation of the laminar flow of the precursor gas, and thus it may be difficult to increase the pressure in the chamber.

However, the method for manufacturing the elementary metal according to the embodiment of the inventive concepts may provide the metal precursor gas in the state where the chamber is sealed or closed, thereby providing the high pressure atmosphere capable of adsorbing the metal precursor gas onto the substrate with high surface coverage.

In particular, the elementary metal formed of metal mono-atoms of several angstroms may be provided by performing each of the operations S100 to S130 once.

In addition, according to an embodiment, the operations S100 to S130 may be performed at the same temperature. In particular, the operations S100 to S130 may be performed at a low temperature. The low temperature used herein may mean a temperature of 200 degrees Celsius or less, in particular, a temperature of 100 degrees Celsius to 200 degrees Celsius. Generally, an aggregation phenomenon may occur in the elementary metal by high reactivity of the metal. Accordingly, the temperature of the process may be maintained at the low temperature of 100 degrees Celsius to 200 degrees Celsius, and thus the aggregation phenomenon of the elementary metal may be prevented.

Hereinafter, a first modified pressure profile in the operation S100 of the inventive concepts will be described with reference to FIGS. 4 and 5. FIG. 4 is a diagram illustrating a first modified pressure profile in an operation S100 according to an embodiment of the inventive concepts, and FIG. 5 is a conceptual view illustrating a pressurization type method for manufacturing elementary metal according to the first modified pressure profile of the inventive concepts. The operations S110 to S130 may be applied to the embodiment described with reference to FIGS. 4 and 5.

The operation S100 may include at least two sub-pressurization dosing operations and a sub-purging operation provided between the at least two sub-pressurization dosing operations. As illustrated in FIG. 4, the operation S100 may include three sub-pressurization dosing operations and two sub-purging operations therebetween. Thus, the operation S100 may provide multi-dosing of the metal precursor gas. In particular, the operation S100 may include four sub-pressurization dosing operations and three sub-purging operations therebetween. Alternatively, the operation S100 may include five sub-pressurization dosing operations and four sub-purging operations therebetween.

In an embodiment, a chamber pressure of the sub-pressurization dosing operation may range from 0.3 Torr to 10 Torr.

In addition, a chamber pressure of the sub-purging operation may be equal to or higher than the pressure of the main purging operation described in the operation S110 and the operation S130.

An adsorption process of the metal precursor gas by the pressure profile illustrated in FIG. 4 will be described in detail with reference to FIG. 5.

Referring to (a) of FIG. 5, the metal precursor gas M may be provided onto the substrate S by the sub-pressurization dosing operation. At this time, even though the metal precursor gas is provided at high pressure, only a portion of the metal precursor gas may be adsorbed on the substrate S.

Referring to (b) of FIG. 5, the metal precursor gas which is not adsorbed on the substrate may be removed or evacuated by the sub-purging operation. At this time, an inert gas may be used in the sub-purging operation. In addition, the pressure in the chamber in the sub-purging operation may be higher than that in the main purging operation. Thus, a portion of the metal precursor gas not adsorbed on the substrate may be reused in a subsequent sub-pressurization dosing operation.

Referring to (c) of FIG. 5, the sub-pressurization dosing operation may be performed again. Thus, the metal precursors M more than the metal precursors illustrated in (a) of FIG. 5 may be adsorbed on the substrate S.

Referring to (d) of FIG. 5, the metal precursor gas which is not adsorbed in the sub-pressurization dosing operation in (c) of FIG. 5 may be removed or evacuated by the sub-purging operation. At this time, the pressure in the chamber may be higher than that in the main purging operation, and thus a portion of the metal precursor gas not adsorbed on the substrate may be reused in a subsequent sub-pressurization dosing operation.

Referring to (e) of FIG. 5, the sub-pressurization dosing operation may be performed again. Thus, the metal precursors M more than the metal precursors illustrated in (c) of FIG. 5 may be adsorbed on the substrate S.

The repeated sub-pressurization dosing operations may be provided by the first modified pressure profile of the operation S100 described with reference to FIGS. 4 and 5, and thus an adsorption rate of the metal precursor gas on the substrate may be further increased.

Meanwhile, the sub-pressurization dosing operation is repeatedly performed three times in the first modified pressure profile described with reference to FIGS. 4 and 5. However, embodiments of the inventive concepts are not limited thereto. In other embodiments, the sub-pressurization dosing operation may be performed two times or four or more times.

Hereinafter, a second modified pressure profile of the operation S100 will be described with reference to FIG. 6. FIG. 6 is a diagram illustrating a second modified pressure profile in the operation S100 according to an embodiment of the inventive concepts.

The pressures of the sub-pressurization dosing operations are equal to each other in the first modified pressure profile of the operation S100 described with reference to FIGS. 4 and 5, but pressures of sub-pressurization dosing operations may increase in the second modified pressure profile to be described with reference to FIG. 6. Differences between the second modified pressure profile and the first modified pressure profile will be mainly described for the purpose of ease and convenience in description.

The operation S100 may include at least two sub-pressurization dosing operations and a sub-purging operation provided between the at least two sub-pressurization dosing operations. As illustrated in FIG. 6, the operation S100 may include first to third sub-pressurization dosing operations and two sub-purging operations between the first to third sub-pressurization dosing operations. In addition, a chamber pressure of the sub-purging operation may be equal to or higher than the pressure of the main purging operation described in the operation S110 and the operation S130.

At this time, pressures of the three sub-pressurization dosing operations may increase from the first sub-pressurization dosing operation to the third sub-pressurization dosing operation. Here, that the pressure of the sub-pressurization dosing operation increases may mean that the pressures of the first, second and third sub-pressurization dosing operations sequentially increase and may also mean that even though the pressure of the second sub-pressurization dosing operation is lower than the pressure of the first sub-pressurization dosing operation, the pressure of the third sub-pressurization dosing operation is higher than the pressure of the first sub-pressurization dosing operation.

In an embodiment, the chamber pressures of the sub-pressurization dosing operations may increase in a range from 0.3 Torr to 10 Torr.

Since the pressures of the sub-pressurization dosing operations increase, metal precursors in a subsequent sub-pressurization dosing operation may be easily adsorbed on sites at which metal precursors are not adsorbed in a previous sub-pressurization dosing operation when the pressure of the subsequent sub-pressurization dosing operation is higher than the pressure of the previous sub-pressurization dosing operation.

The first and second modified pressure profiles in the operation S100 of the inventive concepts were described above with reference to FIGS. 4 to 6. As described above, the first and second modified pressure profiles may improve the adsorption rate of the metal precursor gas on the substrate.

Hereinafter, first and second modified pressure profiles in the operation S120 of the inventive concepts will be described with reference to FIGS. 7 and 8.

FIG. 7 is a diagram illustrating a first modified pressure profile in an operation S120 according to an embodiment of the inventive concepts.

Referring to FIG. 7, the first modified pressure profile in the operation S120 of the inventive concepts may have the same shape as the first modified pressure profile in the operation S100 of the inventive concepts described with reference to FIG. 4.

In other words, the reaction gas dosing operation of the operation S120 may include at least two sub-pressurization dosing operations and a sub-purging operation provided between the at least two sub-pressurization dosing operations. Thus, the operation S120 may provide multi-dosing of the reaction gas.

In particular, the operation S120 may include four sub-pressurization dosing operations and three sub-purging operations therebetween. Alternatively, the operation S120 may include five sub-pressurization dosing operations and four sub-purging operations therebetween.

At this time, a chamber pressure of the sub-pressurization dosing operation may range from 0.3 Torr to 10 Torr. In addition, a chamber pressure of the sub-purging operation may be equal to or higher than the pressure of the main purging operation.

Thus, the reaction gas may easily react with the metal precursor adsorbed on the substrate.

FIG. 8 is a diagram illustrating a second modified pressure profile in the operation S120 according to an embodiment of the inventive concepts.

Referring to FIG. 8, the second modified pressure profile in the operation S120 of the inventive concepts may have the same shape as the second modified pressure profile in the operation S100 of the inventive concepts described with reference to FIG. 6.

In other words, the reaction gas dosing operation of the operation S120 may include at least two sub-pressurization dosing operations and a sub-purging operation between the sub-pressurization dosing operations, and pressures of the sub-pressurization dosing operations may increase. That is, the chamber pressure of the sub-pressurization dosing operation may increase depending on the number of times the sub-pressurization dosing operation is performed, in a range from 0.3 Torr to 10 Torr. In addition, a chamber pressure of the sub-purging operation may be equal to or higher than the pressure of the main purging operation.

Hereinafter, experimental results will be described with reference to the drawings.

FIG. 9 is a graph showing experimental results of a surface coverage according to a dosing pressure of a tungsten metal precursor gas according to an embodiment of the inventive concepts.

The graph of FIG. 9 shows surface coverages measured while increasing the dosing pressure of the operation S100 (see FIG. 1) using a tungsten hexafluoride gas as the metal precursor gas.

Referring to FIG. 9, the surface coverages were 61%, 62.5%, 62%, 65%, 66.5%, 69.5%, 91.5%, 96.5%, 97.5%, and 99%, respectively, when the pressure was increased in the order of 5 mTorr, 10 mTorr, 20 mTorr, 50 mTorr, 100 mTorr, 200 mTorr, 300 mTorr, 1000 mTorr, 2000 mTorr, and 3000 mTorr.

In other words, the surface coverage was as low as about 70% when the dosing pressure of the metal precursor gas was a low pressure of 0.2 Torr. However, when the dosing pressure of the metal precursor gas is increased to 0.3 Torr or more, the surface coverage is about 90% or more and is excellent.

As described above, this may mean that the adsorption rate of the metal precursor gas on the surface of the substrate is significantly increased when the metal precursor gas is supplied into the sealed chamber to form the high pressure in the chamber.

FIG. 10 is a graph showing experimental results of XPS and current according to the number of sub-dosing of a tungsten metal precursor gas according to an embodiment of the inventive concepts, and FIG. 11 is a graph showing experimental results of XPS and current according to the number of sub-pressurization dosing of a reaction gas according to an embodiment of the inventive concepts.

In the graphs of FIG. 10, a tungsten hexafluoride gas was used as the metal precursor gas, and a disilane ($Si_2H_6$) gas was used as the reaction gas. In addition, the first modified pressure profile of the operation S100 in FIG. 4 was applied to a supply pressure of the metal precursor gas.

The graphs of FIG. 10 show magnitudes of XPS and current according to the number of the sub-pressurization dosing operations of the tungsten metal precursor gas. In addition, a total process temperature was maintained at 100 degrees Celsius. The pressure of each of the sub-pressurization dosing operations of the metal precursor gas was 1 Torr, and a maintenance time of each of the sub-pressurization dosing operations was 30 seconds. In other words, the pressure in the chamber was increased to 1 Torr by the sub-pressurization dosing operation, and the substrate was exposed to the pressure of 1 Torr for 30 seconds.

Referring to (a) of FIG. 10, an XPS peak intensity increases in the order of 18653, 31341, 42347, 50189, 55861, 56896, and 57134 as the number of the sub-pressurization dosing operation(s) of the tungsten metal precursor gas increases in the order of 1, 2, 3, 4, 5, 8, and 10. In other words, the XPS peak intensity increases as the number of the sub-pressurization dosing operation(s) of the metal precursor gas increases. In particular, when the number of the sub-pressurization dosing operations of the metal precursor gas is 5, the XPS peak intensity is saturated.

Referring to (b) of FIG. 10, the amount of the current increases in the order of 12.3 nA, 15.9 nA, 17.8 nA, 19.4 nA, 20.2 nA, 20.4 nA, and 20.7 nA as the number of the sub-pressurization dosing operation(s) of the tungsten metal precursor gas increases in the order of 1, 2, 3, 4, 5, 8, and 10. In other words, the amount of the current increases as the number of the sub-pressurization dosing operation(s) of the metal precursor gas increases. In particular, when the number of the sub-pressurization dosing operations of the metal precursor gas is 5, the current is saturated.

This may mean that the adsorption rate of the metal precursor on the surface of the substrate is saturated when the number of the sub-pressurization dosing operations of the metal precursor gas is 5 or more.

The graph of FIG. 11 shows results of an experiment in which a tungsten hexafluoride gas was used as the metal precursor gas, a disilane ($Si_2H_6$) gas was used as the reaction gas, and the first modified pressure profile of the operation S120 of FIG. 7 was applied.

The graphs of FIG. 11 show magnitudes of XPS and current according to the number of the sub-pressurization dosing operations of the reaction gas. A total process temperature was maintained at 100 degrees Celsius. The pressure of each of the sub-pressurization dosing operations of the reaction gas was 1 Torr, and a maintenance time of each of the sub-pressurization dosing operations was 30 seconds. In other words, the pressure in the chamber was increased to 1 Torr by the sub-pressurization dosing operation, and the substrate was exposed to the pressure of 1 Torr for 30 seconds.

Referring to (a) of FIG. 11, an XPS peak intensity increases in the order of 23415, 47123, 54123, 55997, 56324, 57011, and 57023 as the number of the sub-pressurization dosing operation(s) of the reaction gas increases in the order of 1, 2, 3, 4, 5, 8, and 10. In other words, the XPS peak intensity increases as the number of the sub-pressurization dosing operation(s) of the reaction gas increases. In particular, when the number of the sub-pressurization dosing operations of the reaction gas is 5, the XPS peak intensity is saturated.

Referring to (b) of FIG. 11, the amount of the current increases in the order of 12.3 nA, 17.6 nA, 19.8 nA, 20.1 nA, 20.2 nA, 20.4 nA, and 20.5 nA as the number of the sub-pressurization dosing operation(s) of the reaction gas increases in the order of 1, 2, 3, 4, 5, 8, and 10. In other words, the amount of the current increases as the number of the sub-pressurization dosing operation(s) of the reaction gas increases. In particular, when the number of the sub-pressurization dosing operations of the reaction gas is 5, the current is saturated.

This may be because an adsorption rate of the reaction gas on the surface of the substrate is saturated when the number of the sub-pressurization dosing operations of the reaction gas is 5 or more.

FIG. 12 shows images showing a surface roughness change according to the number of sub-pressurization dosing of a tungsten metal precursor gas according to an embodiment of the inventive concepts.

The images of FIG. 12 show results of an experiment in which a tungsten hexafluoride gas was used as the metal precursor gas, a disilane (Si2H6) gas was used as the reaction gas, and the first modified pressure profile of the operation S100 of FIG. 4 was applied.

The images of FIG. 12 show a surface roughness according to the number of the sub-pressurization dosing operations of the metal precursor gas. Here, the number of the sub-pressurization dosing operations of the reaction gas was fixed to 5. In addition, a total process temperature was maintained at 100 degrees Celsius. The pressure of each of the sub-pressurization dosing operations of the metal precursor gas and the reaction gas was 1 Torr, and a maintenance time of each of the sub-pressurization dosing operations was 30 seconds. In other words, the pressure in the chamber was increased to 1 Torr by the sub-pressurization dosing operation, and the substrate was exposed to the pressure of 1 Torr for 30 seconds.

Referring to FIG. 12, the surface roughness decreases as the number of the sub-pressurization dosing operation(s) of the metal precursor gas increases. This may mean that a uniform elementary metal is formed as the number of the sub-pressurization dosing operations increases.

FIG. 13 shows TEM images of a tungsten elementary metal according to an embodiment of the inventive concepts.

FIG. 13 shows TEM images of the elementary metal formed by performing the sub-pressurization dosing operation of the metal precursor gas 5 times and by performing the sub-pressurization dosing operation of the reaction gas 5 times. Other conditions were the same as described above.

Referring to FIG. 13, it may be recognized that the elementary metal having a thin thickness of 0.8 nm is formed.

FIG. 14 is a graph showing experimental results of a surface coverage according to a dosing pressure of a molybdenum metal precursor gas according to an embodiment of the inventive concepts.

The graph of FIG. 14 shows surface coverages measured while increasing the dosing pressure of the operation S100 (see FIG. 1) using a molybdenum hexafluoride gas as the metal precursor gas.

Referring to FIG. 14, the surface coverages were 68%, 69%, 70%, 72%, 73%, 92%, 94%, 95%, 98%, and 98% at dosing pressures of 10 mTorr, 20 mTorr, 50 mTorr, 100 mTorr, 200 mTorr, 300 mTorr, 500 mTorr, 1000 mTorr, 2000 mTorr, and 3000 mTorr, respectively.

In other words, the surface coverage was lower than about 75% when the dosing pressure of the metal precursor gas was a low pressure of 0.2 Torr. However, when the dosing pressure of the metal precursor gas is increased to 0.3 Torr or more, the surface coverage is about 90% or more and is excellent.

As described above, this may mean that the adsorption rate of the metal precursor gas on the surface of the substrate is significantly increased when the metal precursor gas is supplied into the sealed chamber to form the high pressure in the chamber.

FIG. 15 is a graph showing experimental results of XPS and current according to the number of sub-dosing of a molybdenum metal precursor gas according to an embodiment of the inventive concepts, and FIG. 16 is a graph showing experimental results of XPS and current according to the number of sub-pressurization dosing of a reaction gas according to an embodiment of the inventive concepts.

In the graphs of FIG. 15, a molybdenum hexafluoride gas was used as the metal precursor gas, and a disilane (Si2H6) gas was used as the reaction gas. In addition, the first modified pressure profile of the operation S100 in FIG. 4 was applied to a supply pressure of the metal precursor gas.

The graphs of FIG. 15 show magnitudes of XPS and current according to the number of the sub-pressurization dosing operations of the molybdenum metal precursor gas. A total process temperature was maintained at 100 degrees Celsius. The pressure of each of the sub-pressurization dosing operations of the metal precursor gas was 1 Torr, and a maintenance time of each of the sub-pressurization dosing operations was 30 seconds. In other words, the pressure in the chamber was increased to 1 Torr by the sub-pressurization dosing operation, and the substrate was exposed to the pressure of 1 Torr for 30 seconds.

Referring to (a) of FIG. 15, the amount of the current increases in the order of 21.4 nA, 39 nA, 43 nA, 48.3 nA, 48.4 nA, 49.1 nA, and 48.8 nA as the number of the sub-pressurization dosing operation(s) of the molybdenum metal precursor gas increases in the order of 1, 2, 3, 4, 5, 8, and 10. In other words, the amount of the current increases as the number of the sub-pressurization dosing operation(s) of the metal precursor gas increases. In particular, when the number of the sub-pressurization dosing operations of the metal precursor gas is 4, the current is saturated.

Referring to (b) of FIG. 15, an XPS peak intensity increases in the order of 23859, 37784, 43680, 46833, 47299, 47249, and 47593 as the number of the sub-pressurization dosing operation(s) of the molybdenum metal precursor gas increases in the order of 1, 2, 3, 4, 5, 8, and 10. In other words, the XPS peak intensity increases as the number of the sub-pressurization dosing operation(s) of the metal precursor gas increases. In particular, when the number of the sub-pressurization dosing operations of the metal precursor gas is 4, the XPS peak intensity is saturated.

This may mean that the adsorption rate of the metal precursor on the surface of the substrate is saturated when the number of the sub-pressurization dosing operations of the metal precursor gas is 4 or more.

The graphs of FIG. 16 show results of an experiment in which a molybdenum hexafluoride gas was used as the metal precursor gas, a disilane (Si2H6) gas was used as the reaction gas, and the first modified pressure profile of the operation S120 of FIG. 7 was applied. The number of the sub-pressurization dosing operations of the metal precursor gas was fixed to 5.

The graphs of FIG. 16 show magnitudes of XPS and current according to the number of the sub-pressurization dosing operations of the reaction gas. A total process temperature was maintained at 100 degrees Celsius. The pressure of each of the sub-pressurization dosing operations of the reaction gas was 1 Torr, and a maintenance time of each of the sub-pressurization dosing operations was 30 seconds.

Referring to (a) of FIG. 16, the amount of the current increases in the order of 35 nA, 41 nA, 45 nA, 48.5 nA, 48.6 nA, 49.1 nA, and 49 nA as the number of the sub-pressurization dosing operation(s) of the reaction gas increases in the order of 1, 2, 3, 4, 5, 8, and 10. In other words, the amount of the current increases as the number of the sub-pressurization dosing operation(s) of the reaction gas increases. In particular, when the number of the sub-pressurization dosing operations of the reaction gas is 4, the current is saturated.

Referring to (b) of FIG. 16, an XPS peak intensity increases in the order of 36168, 43431, 45174, 46669, 46931, 47586, and 47513 as the number of the sub-pressurization dosing operation(s) of the reaction gas increases in the order of 1, 2, 3, 4, 5, 8, and 10. In other words, the XPS peak intensity increases as the number of the sub-pressurization dosing operation(s) of the reaction gas increases. In particular, when the number of the sub-pressurization dosing operations of the reaction gas is 4, the XPS peak intensity is saturated.

increasing a pressure, thereby depositing a tungsten elementary metal. Thus, the tungsten elementary metal was manufactured.

TABLE 1

|  | $WF_6$ | P | $WF_6$ | P | $WF_6$ | P | $WF_6$ | P | $WF_6$ | P |
|---|---|---|---|---|---|---|---|---|---|---|
| Time | 30 s | 30 s | 30 s | 30 s | 30 s | 30 s | 30 s | 30 s | 30 s | 30 s |
| Pressure | 1.0 Torr |  | 1.0 Torr |  | 1.0 Torr |  | 1.0 Torr |  | 1.0 Torr |  |

TABLE 2

|  | $Si_2H_6$ | P | $Si_2H_6$ | P | $Si_2H_6$ | P | $Si_2H_6$ | P | $Si_2H_6$ | P |
|---|---|---|---|---|---|---|---|---|---|---|
| Time | 30 s | 30 s | 30 s | 30 s | 30 s | 30 s | 30 s | 30 s | 30 s | 30 s |
| Pressure | 1.0 Torr |  | 1.0 Torr |  | 1.0 Torr |  | 1.0 Torr |  | 1.0 Torr |  |

This may be because an adsorption rate of the reaction gas on the surface of the substrate is saturated when the number of the sub-pressurization dosing operations of the reaction gas is 4 or more.

FIG. 17 is an image showing a surface roughness of a molybdenum monolayer structure according to an embodiment of the inventive concepts. Here, the number of the sub-pressurization dosing operations of the reaction gas was fixed to 4. In addition, a total process temperature was maintained at 100 degrees Celsius. The pressure in each of the sub-pressurization dosing operations of molybdenum hexafluoride ($MoF_6$) and disilane ($Si_2H_6$) was 1 Torr, and the maintenance time was 30 seconds.

Referring to FIG. 17, the surface roughness is 1.64 angstroms. In other words, the surface roughness is very small. This may mean that a uniform elementary metal is formed by a plurality of the sub-pressurization dosing operations.

The method for manufacturing the elementary metal according to the embodiments of the inventive concepts was described above with reference to FIGS. 1 to 17. The elementary metal according to an embodiment of the inventive concepts may have amorphous characteristics. Hereinafter, crystal characteristics of the elementary metal manufactured according to an embodiment of the inventive concepts will be described with reference to FIG. 18.

To observe the crystal characteristics of the elementary metal according to an embodiment of the inventive concepts, the elementary metal was manufactured by the manufacturing method according to the embodiments of the inventive concepts.

For this end, in a state where a first sub-pressurization dosing operation of supplying $WF_6$ was performed to increase a pressure in a chamber to 1.0 Torr, an inlet and an outlet of the chamber were closed and a source gas ($WF_6$) permeated at the pressure of 1.0 Torr for 30 seconds. Thereafter, a sub-purging operation was performed. Subsequently, in a state where a second sub-pressurization dosing operation of supplying $WF_6$ was performed to increase a pressure in the chamber to 1.0 Torr, the inlet and the outlet of the chamber were closed and a source gas ($WF_6$) permeated at the pressure of 1.0 Torr for 30 seconds. This method was repeated until a sub-permeation operation was performed after a fifth sub-pressurization dosing operation. Thereafter, a sub-purging operation was performed.

A unit cycle consisting of $WF_6$, P (purge), $Si_2H_6$, and P was repeated a desired number of times while gradually Purging operations represented by last P of the tables 1 and 2 may correspond to a first main purging operation and a second main purging operation, respectively.

In the manufacturing method referring to the tables 1 and 2, the number of the pressurization type deposition process cycle(s) of the elementary metal may be controlled to adjust a thickness of the deposited elementary metal. For example, 7 cycles may be repeated to deposit elementary metal having a thickness of 1 nm, and 10 cycles may be repeated to deposit elementary metal having a thickness of 1.5 nm. 20 cycles may be repeated to deposit elementary metal having a thickness of 3 nm, and 33 cycles may be repeated to deposit elementary metal having a thickness of 5 nm.

Referring to FIG. 18, it may be recognized that the tungsten elementary metal manufactured according to the embodiment of the inventive concepts has the amorphous characteristics when its thickness is 5 nm or less. In addition, the amorphous characteristics are more clearly shown as the thickness of the elementary metal decreases (in particular, when the thickness of the elementary metal is less than 3 nm).

FIG. 19 is a schematic view illustrating an apparatus for manufacturing elementary metal, according to an embodiment of the inventive concepts. The apparatus for manufacturing elementary metal, which will be described with reference to FIG. 19, may be applied to the method for manufacturing the elementary metal, described above. Components of the apparatus for manufacturing elementary metal according to an embodiment of the inventive concepts will be described hereinafter.

Referring to FIG. 19, the apparatus for manufacturing elementary metal according to an embodiment of the inventive concepts may include a chamber 100. The chamber 100 may provide a receiving space capable of receiving a substrate S on which elementary metal will be formed. A stage 102 on which the substrate S is placed may be provided in the receiving space of the chamber 100.

The chamber 100 may further include an inlet 120 for sequentially supplying a metal precursor gas, an inert gas, a reaction gas, and the inert gas and an outlet 140 for exhausting an injected gas. In addition, an outlet valve 142 for controlling an exhausting amount may be coupled to the outlet 140.

In addition, the apparatus for manufacturing elementary metal according to an embodiment may further include a metal precursor gas storage unit 110 for storing the metal precursor gas, an inert gas storage unit 112 for storing the inert gas, and a reaction gas storage unit 114 for storing the reaction gas. Here, the metal precursor gas storage unit 110 may store tungsten hexafluoride ($WF_6$) or molybdenum hexafluoride ($MoF_6$), the inert gas storage unit 112 may store an argon or nitrogen gas, and the reaction gas storage unit 114 may store a disilane ($Si_2H_6$) gas.

The metal precursor gas stored in the metal precursor gas storage unit 110 may be provided into the inlet 120 of the chamber 100 through a metal precursor gas control valve 130. The inert gas stored in the inert gas storage unit 112 may be provided into the inlet 120 of the chamber 100 through an inert gas control valve 132. In addition, the reaction gas stored in the reaction gas storage unit 114 may be provided into the inlet 120 of the chamber 100 through a reaction gas control valve 134.

Furthermore, the apparatus for manufacturing elementary metal according to an embodiment may further include a controller 150. The controller 150 may control the components of the apparatus to perform the method for manufacturing the elementary metal according to the embodiment of the inventive concepts.

In more detail, the controller 150 may control the metal precursor gas control valve 130, the inert gas control value 132, and the reaction gas control valve 134 to sequentially supply the metal precursor gas, the inert gas, the reaction gas, and the inert gas into the inlet 120 of the chamber 100. In addition, in the operation S100 (see FIG. 1), the controller 150 may open the metal precursor gas control valve 130 and may close the outlet valve 142, thereby sealing or closing the inside of the chamber 100. Thus, the inside of the chamber 100 may be maintained at the high pressure (e.g., a pressure of 0.3 Torr to 100 Torr). As a result, the adsorption rate of the metal precursor gas may be significantly improved. In other words, the controller 150 may control the pressure in the chamber 100, and thus the surface coverage of the metal precursor gas adsorbed on the substrate may be improved to 90% or more.

Moreover, to realize the first modified pressure profile of the operation S100 illustrated in FIG. 4, the controller 150 may open the metal precursor gas control valve 130 and close the outlet valve 142 in the sub-pressurization dosing operation of the metal precursor gas. In addition, the controller 150 may open both the inert gas control valve 132 and the outlet valve 142 in the sub-purging operation. Thus, when the metal precursor gas is provided into the chamber 100, the controller 150 may provide at least two sub-pressurization dosing pressures and a sub-purging pressure between the at least two sub-pressurization dosing pressures. Here, magnitudes of the at least two sub-pressurization dosing pressures may be equal to each other. In addition, the controller 150 may control the sub-purging pressure in such a way that the sub-purging pressure is equal to or greater than a main purging pressure at which the inert gas is supplied into the chamber 100.

Furthermore, the controller 150 may control opening and closing degrees of the valves to realize the second modified pressure profile of the operation S100 illustrated in FIG. 6. At this time, each of magnitudes of at least two sub-pressurization dosing pressures may increase depending on the number of sub-pressurization dosing. In addition, the controller 150 may control the sub-purging pressure in such a way that the sub-purging pressure is equal to or greater than the main purging pressure at which the inert gas is supplied into the chamber 100.

Furthermore, to realize the first modified pressure profile of the operation S120 illustrated in FIG. 7, the controller 150 may open the reaction gas control valve 134 and close the outlet valve 142 in the sub-pressurization dosing operation of the reaction gas. In addition, the controller 150 may open both the inert gas control valve 132 and the outlet valve 142 in the sub-purging operation.

Likewise, the controller 150 may control opening and closing degrees of the valves to realize the second modified pressure profile of the operation S120 illustrated in FIG. 8.

Furthermore, the controller 150 may maintain a constant temperature in the chamber 100 when the metal precursor gas, the inert gas or the reaction gas is supplied into the chamber 100. For example, the controller 150 may control the temperature of the chamber 100 in a range of 100 degrees Celsius to 200 degrees Celsius.

The method for manufacturing elementary metal, according to the embodiment of the inventive concepts, may include the metal precursor gas pressurization dosing operation of, in the state where the inside of the chamber having the substrate is sealed, increasing the pressure in the chamber by providing the metal precursor gas consisting of the metal precursors to adsorb the metal precursors onto the substrate, the main purging operation of purging a gas after the metal precursor gas pressurization dosing operation, the reaction gas dosing operation of providing the reaction gas to reduce the metal precursors adsorbed on the substrate to the elementary metal after the main purging operation, and the main purging operation of purging a gas after the reaction gas dosing operation.

Since the metal precursor gas is provided in the high pressure atmosphere, the adsorption rate of the metal precursors on the substrate may be significantly improved. Thus, the elementary metal having a conformal monolayer may be provided.

While the inventive concepts have been described with reference to exemplary embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A pressurization type apparatus for manufacturing elementary metal, the pressurization type apparatus comprising:
   an inlet into which a metal precursor gas consisting of metal precursors, an inert gas, a reaction gas, and an inert gas are sequentially provided;
   a chamber connected to the inlet and configured to receive a substrate;
   an outlet through which a gas injected in the chamber is exhausted;
   a metal precursor gas storage unit for storing the metal precursor gas, an inert gas storage unit for storing the inert gas, and a reaction gas storage unit for storing the reaction gas;
   a metal precursor gas control valve positioned between the metal precursor gas storage unit and the inlet and configured to regulate the flow of the metal precursor gas, an inert gas control value positioned between the inert gas storage unit and the inlet and configured to regulate the flow of the inert gas, and a reaction gas control valve positioned between the reaction gas storage unit and the inlet and configured to regulate the flow of the reaction gas; and a controller configured to open the metal precursor gas control valve and close the outlet valve to provide the metal precursor gas into the chamber and increase a pressure in the chamber to adsorb the metal precursor gas onto the substrate in a state where an inside of the chamber having the substrate is sealed by closing the outlet for a first sub-pressurization metal precursor dosing operation, open both the inert gas control valve and the outlet valve for a sub-purging operation after the first sub-pressurization metal precursor dosing operation, open the metal precursor gas control valve and close the outlet valve to provide the metal precursor gas into the chamber and increase the pressure in the chamber to adsorb the metal precursor gas onto the substrate in a state where the inside of the chamber having the substrate is sealed by closing the outlet for a second sub-pressurization metal precursor dosing operation after the sub-purging operation, open both the inert gas control valve and the outlet valve for a first main purging operation after the second sub-pressurization metal precursor dosing operation, open the reaction gas control valve to provide the reaction gas into the chamber for a reaction gas dosing operation after the first main purging operation, and then open both the inert gas control valve and the outlet valve for a second main purging operation after the reaction gas dosing operation, wherein the controller is configured such that the first sub-pressurization metal precursor dosing operation and the second sub-pressurization metal precursor dosing operation are consecutively performed.

2. The pressurization type apparatus of claim 1, wherein the controller is configured to control the pressure in the chamber in a range of 0.3 Torr to 100 Torr when the metal precursor gas is provided into the chamber.

3. The pressurization type apparatus of claim 1, wherein the pressure in the chamber for the second sub-pressurization dosing operation is higher than the pressure in the chamber for the first sub-pressurization dosing operation.

* * * * *